United States Patent
Andreou et al.

(10) Patent No.: US 6,720,830 B2
(45) Date of Patent: Apr. 13, 2004

(54) LOW-POWER, DIFFERENTIAL OPTICAL RECEIVER IN SILICON ON INSULATOR

(75) Inventors: Andreas G. Andreou, Baltimore, MD (US); Alyssa Apsel, Ithaca, NY (US)

(73) Assignee: Johns Hopkins University, Baltimore, MD (US)

( * ) Notice: Subject to any disclaimer, the term of this patent is extended or adjusted under 35 U.S.C. 154(b) by 0 days.

(21) Appl. No.: 10/166,052

(22) Filed: Jun. 11, 2002

(65) Prior Publication Data

US 2003/0025562 A1 Feb. 6, 2003

Related U.S. Application Data

(60) Provisional application No. 60/296,748, filed on Jun. 11, 2001.

(51) Int. Cl.[7] ............................................. H03F 3/45
(52) U.S. Cl. ...................................... 330/253; 330/260
(58) Field of Search ................................ 330/253, 260, 330/277, 307, 308

(56) References Cited

U.S. PATENT DOCUMENTS

| | | | | |
|---|---|---|---|---|
| 5,221,909 A | * | 6/1993 | Cole | 330/253 |
| 5,631,606 A | * | 5/1997 | Tran | 330/253 |
| 5,706,092 A | | 1/1998 | Stannard et al. | |
| 5,895,957 A | | 4/1999 | Reedy et al. | |
| 6,590,453 B2 | * | 7/2003 | Tran et al. | 330/253 X |

FOREIGN PATENT DOCUMENTS

| | | |
|---|---|---|
| DE | 3215661 A1 | 12/1982 |
| DE | 3316683 A1 | 11/1983 |
| JP | 06224652 | 8/1994 |
| JP | 10200385 | 7/1998 |
| WO | WO 01/97294 | 12/2001 |

OTHER PUBLICATIONS

Simonis, et al.; "Silicon–on–Sapphire CMOS for Improved VCSEL/CMOS Optoelectronic Interconnects"; IEEE; pp. 169–170.

Pennala, et al.; "A 4 GHz differential transimpendance amplifier channel for a pulsed time–of–flight laser radar"; University of Oulu, Department of Electrical Engineering and Infotech Oulu Electronics Laboratory; Linnanmaa, FIN–90570 Oulu, Finland; IEEE; pp. 229–232.

Phang, et al.; "A CMOS Optical Preamplifier for Wireless Infrared Communications"; IEEE Transactions on Circuits and Systems–II: Analog and Digital Signal Processing, vol. 46, No. 7, Jul. 1999; pp. 852–859.

Woodward, et al.; "Low–power, small–footprint gigabit Ethernet–compatible optical receiver circuit in 0.25 $\mu$m CMOS"; Electronics Letters $17^{th}$ Aug. 2000; vol. 36 No. 17; pp. 1489–1491.

(List continued on next page.)

Primary Examiner—Steven J. Mottola
(74) Attorney, Agent, or Firm—Edell, Shapiro & Finnan

(57) ABSTRACT

A low-power differential optical receiver useful for high-speed optical communication between CMOS chips includes a multi-stage differential amplifier circuit including a first differential transimpedance stage (22) followed by a plurality of differential feed-forward, high-bandwidth gain stages (24) and a final, differential-to-single-ended converter output stage (26). The inputs of the transimpedance stage receive input signals from a MSM or PIN diode photodetector. Transistors having plural, different threshold levels are employed within each differential amplifier stage to reduce the size of the footprint of the circuit and improve the gain and bandwidth while decreasing the parasitic capacitance. The optical receiver is fabricated on a silicon on insulator chip, such as in an ultra-thin silicon on sapphire CMOS process which enables the design of high speed circuits with low power consumption and no substrate cross-talk. The circuit design is well-suited for use in a multi-dimensional array of optical interconnects between CMOS chips or platforms.

17 Claims, 10 Drawing Sheets LLC

OTHER PUBLICATIONS

Andreou, et al.; "Silicon on Sapphire CMOS for Optoelectronic Microsystems"; IEEE; pp. 22–29.

Apsel, et al; "5mW, Gbits/s silicon on sapphire CMOS optical receiver"; Electronics Letters 13$^{th}$ Sep. 2001; vol. 37 No. 19; pp. 1186–1188.

Ingels, et al.; "A CMOS 18THzΩ 240 Mb/s Transimpedance Amplifier and 155 Mb/s LED–Driver for Low Cost Optical Fiber Links"; IEEE Journal of Solid–State Circuits, vol. 19 No. 12, Dec. 1994; pp. 1552–1559.

Ingels, et al.; "A I–Gb/s 0.7–$\mu$m CMOS Optical Receiver with Full Rail–to–Rail Output Swing"; IEEE Journal of Solid–State Circuits, vol. 34 No. 7, Jul. 1999; pp. 971–977.

Jayakumar, et al.; "3–V MSM–TIA for Gigabit Ethernet"; IEEE Journal of Solid–State Circuits, vol. 35 No. 9, Sep. 2000; pp. 1271–1275.

Simonis, et al.; "I Gb/s VCSEL/CMOS Flip–Chip 2–D–Array Interconnects and Associated Diffractive Optics"; Army Research Laboratory, AMSRL–SE–EM, Adelphi, MD; University of Maryland, College Park, MD; University of Delaware, Newark, DE; pp. 1–9.

* cited by examiner

LOW-POWER, DIFFERENTIAL OPTICAL RECEIVER IN SILICON ON INSULATOR

CROSS REFERENCE TO RELATED APPLICATION

This application claims priority from U.S. Provisional Patent Application Serial No. 60/296,748, entitled "Low Power, Differential Optical Receiver in Silicon on Sapphire," filed Jun. 11, 2001. The disclosure of this provisional patent application is incorporated herein by reference in its entirety.

BACKGROUND OF THE INVENTION

1. Field of the Invention

The present invention relates to an optical receiver and, more particularly, to a differential optical receiver fabricated in ultra-thin silicon on sapphire CMOS permitting low-power, high-speed operation useful for communication between CMOS chips or platforms and with vertical cavity surface emitting laser (VCSEL) array technology.

2. Description of the Related Art

Processors fabricated in deep sub-micron CMOS (complimentary metal oxide semiconductor) have rapidly advanced to where internal data is processed at gigahertz rates. While computation proceeds at gigahertz rates internally, external wiring and buses have become the bottleneck of high performance systems. In order to maintain high bandwidth operation of multi-chip systems, optical signals are increasingly used as the media for parallel inter-chip communication. With the advent of vertical cavity surface emitting lasers (VCSELs), it is now possible to increase data transmission capacity between CMOS chips by using arrays of high bandwidth optical sources and detectors. For practical purposes, small footprint, low-power receiver arrays are highly desirable in these system.

Such optical communication channels require conversion of optical signals into electrical signals and vice-versa. High speed performance of optical interconnects is typically limited by the high speed performance of optical receivers. While many optical detectors (PIN diodes and MSMs) have bandwidths above 20 GHz, photocurrent may be as low as 10 $\mu$A for incident laser input, as noted by Gupta in "Handbook of Photonics," CRC Press, 1997, the disclosure of which is incorporated herein by reference in its entirety. Most designers approach this problem by using limited bandwidth and high gain, or by supplying additional power. Limited bandwidth approaches are described by Ingels et al. in "A CMOS 18 thz-ohm 240 mb/s transimpedance amplifier and 155 mb/s led-driver for low cost optical fiber links," *IEEE J. Solid State Circuits*, 29(12):1552+, December 1994, and by Phang et al. in "A CMOS optical preamplifier for wireless infrared communications," *IEEE Trans. Circuits and Systems*, 46(7):852–859, July 1999, the disclosures of which are incorporated herein by reference in their entireties. Commercial Anadigics receiver circuits require 0.1 W at 2 GHz bandwidth, as reported by Jayakumar et al. in "3-v MSM TIA for gigabit Ethernet," *Journal of Solid-State Circuits*, 35(9), September 2000, the disclosure of which is incorporated herein by reference in its entirety. Another solution has been to design receiver circuits directly on optical detector substrates. These designs are limited in their practical use, since they are not supported by the silicon design and fabrication infrastructure.

A 0.25 $\mu$m CMOS design operating at 1.5 Gbit/s consuming 26 mW is disclosed by Woodward et al. in "Low-power, small-footprint gigabit Ethernet-compatible optical receiver circuit in 0.25 $\mu$m CMOS," *Electronics Letters*, 36(17):1489+, August 2000, the disclosure of which is incorporated herein by reference in its entirety. A number of other designs consuming over 100 mW per channel have been reported, including those described in the aforementioned paper by Phang et al. and by Ingels et al. in "A 1-gb/s, 0.7-$\mu$m CMOS optical receiver with full rail-to-rail output swing," *IEEE J. Solid State Circuits*, 34(7):971+, July 1999, the disclosure of which is incorporated herein by reference in its entirety. However, high-speed optical detector devices which consume less power (e.g., under 10 mW) have not yet been developed. Accordingly, there remains a need for a fast, low-power CMOS-based optical receiver to facilitate commercial development of optical detector arrays for use in high-speed CMOS electronics.

SUMMARY OF THE INVENTION

Therefore, in light of the above, and for other reasons that become apparent when the invention is fully described, an object of the present invention is to provide a high-speed, low-power optical receiver.

A further object of the present invention is to provide an optical receiver suitable for forming optical receiver arrays.

Yet a further object of the present invention is to provide an optical receiver compatible with high-speed CMOS circuits.

A still further object of the present invention is to provide an optical receiver which allows for the production of stacked integrated circuit devices with optical vias.

Another object of the present invention is to provide a fully differential optical receiver to reject interference, electrical offsets, and power supply noise.

Yet another object of the present invention is to minimize the footprint of an integrated circuit optical receiver.

The aforesaid objects are achieved individually and in combination, and it is not intended that the present invention be construed as requiring two or more of the objects to be combined unless expressly required by the claims attached hereto.

In accordance with the present invention, a fully differential optical receiver circuit is designed for low-power, high-bandwidth, optical communication between CMOS chips or platforms, such as in stacked, multi-chip CMOS architectures employing optical inter-chip communication. In an exemplary embodiment, a linear array of CMOS optical receivers formed on a single chip operates in parallel from a common power supply. The receiver chip is fabricated in an Ultra-Thin Silicon on Sapphire (Utsi) CMOS 0.5 $\mu$m process which enables the design of high speed circuits with low power consumption and no substrate cross-talk. Each optical receiver channel in the array comprises a multi-stage differential amplifier circuit comprising a first differential transimpedance stage followed by a plurality of differential feed-forward, high-bandwidth gain stages and a final, differential-to-single-ended converter output stage. The inputs of the transimpedance stage receive a differential input signal from metal-semiconductor-metal (MSM) or PIN diode photo-detectors. In accordance with another aspect of the present invention, a novel cross-coupled transimpedance stage is preferably used as the input stage of the optical receiver when capacitive loads from the optical detectors can be made small (e.g., with MSMs), since high gain can be achieved in this architecture without large input gates. Each channel of the array consumes 5 mW of power from a 3.3 V supply with a transimpedance gain of 25 k$\Omega$, and may operate up to 1 Gbit/s with 0.5 pF MSM photo-detectors. This is the fastest CMOS receiver known to the inventors that consumes under 10 mW.

An important aspect of the present invention which is facilitated by the use of silicon on insulator technology is the use of varied or different threshold transistors within each differential amplifier stage. With lower gate thresholds, certain transistors serve as current sources, providing more current per unit size, reducing the overall size of the footprint of the circuit, and improving the bandwidth by decreasing the parasitic capacitance. By contrast, the input switching transistors of each amplifier stage have higher thresholds.

As a differential receiver, the circuit effectively rejects electrical interference, power supply noise and voltage offsets. These characteristics make the optical receiver cell of the present invention ideal for use in a multidimensional array of optical interconnects. The advent of ultra-thin silicon on sapphire CMOS enables the optical receiver of the present invention to overcome many of the power and speed constraints which limit bulk CMOS receiver performance. Substrate isolation in Silicon on Sapphire (SOS) CMOS is used in the design of the optical receivers to reduce crosstalk, noise, and instability that are characteristic of bulk CMOS receiver designs. Due to the absence of significant parasitic capacitance, the sapphire substrate permits a greater number of amplifier stages to be formed in the optical receiver, thereby yielding greater receiver gain.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

The following detailed explanations of FIGS. 1–8 and of the preferred embodiments reveal the methods and apparatus of the present invention. The optical receiver of the present invention is a fully differential receiver circuit designed for fabrication in a silicon on sapphire (SOS) CMOS process. The circuit is particularly well-suited for low-power, high-bandwidth, optical communication between CMOS chips or platforms. As a differential receiver, it is effective at electrical interference rejection, power supply noise rejection, and offset rejection. These characteristics are ideal for use in a multidimensional array of interconnects and allows for the production of stacked devices with optical vias. An optical via is a connection through substrates between a transmitter and receiver at different levels in a vertically stacked array of micro-chips.

In addition to the optical characteristics of SOS CMOS, there are several other characteristics of this media which can be utilized to design efficient, array-able optical receivers. SOS fabrication processes result in devices without parasitic bulk capacitances. This facilitates the design of faster circuits driving only small junction capacitances as loads. Bulk-less design has other advantages as well. Multi-stage amplifiers such as those employed in the optical receiver of the present invention do not suffer stability degradation via substrate feedback, allowing the design of multi-layer high-gain amplifiers. In addition, use of a sapphire substrate reduces cross-talk between receiver channels. In typical bulk CMOS amplifiers, cross-talk occurs between circuits by conduction through semi-conducting substrates. Sapphire provides additional circuit isolation, virtually eliminating this problem, and allows high speed signals to be resolved simultaneously on a single chip.

Hybridization of VCSELs and detectors with Silicon on Sapphire (SOS) CMOS chips for communication through sapphire substrates has been demonstrated in high bandwidth communication applications, as reported by Andreou et al. in "Gigabit optical vias using surface emitting VCSELs integrated with silicon on sapphire (SOS) CMOS," subm. *IEEE Electronics Letters*, October 2000 and by Simonis et al. in "1 Gb/s VCSEL/CMOS flip-chip 2D-array interconnects and associated diffractive optics," subm. *IEEE Computer Society*, October 1999, the disclosures of which are incorporated herein by reference in their entireties. The optical receiver of the present invention is particularly well-suited for use in the context of such SOS CMOS chips and optoelectronic devices.

Figure 1:
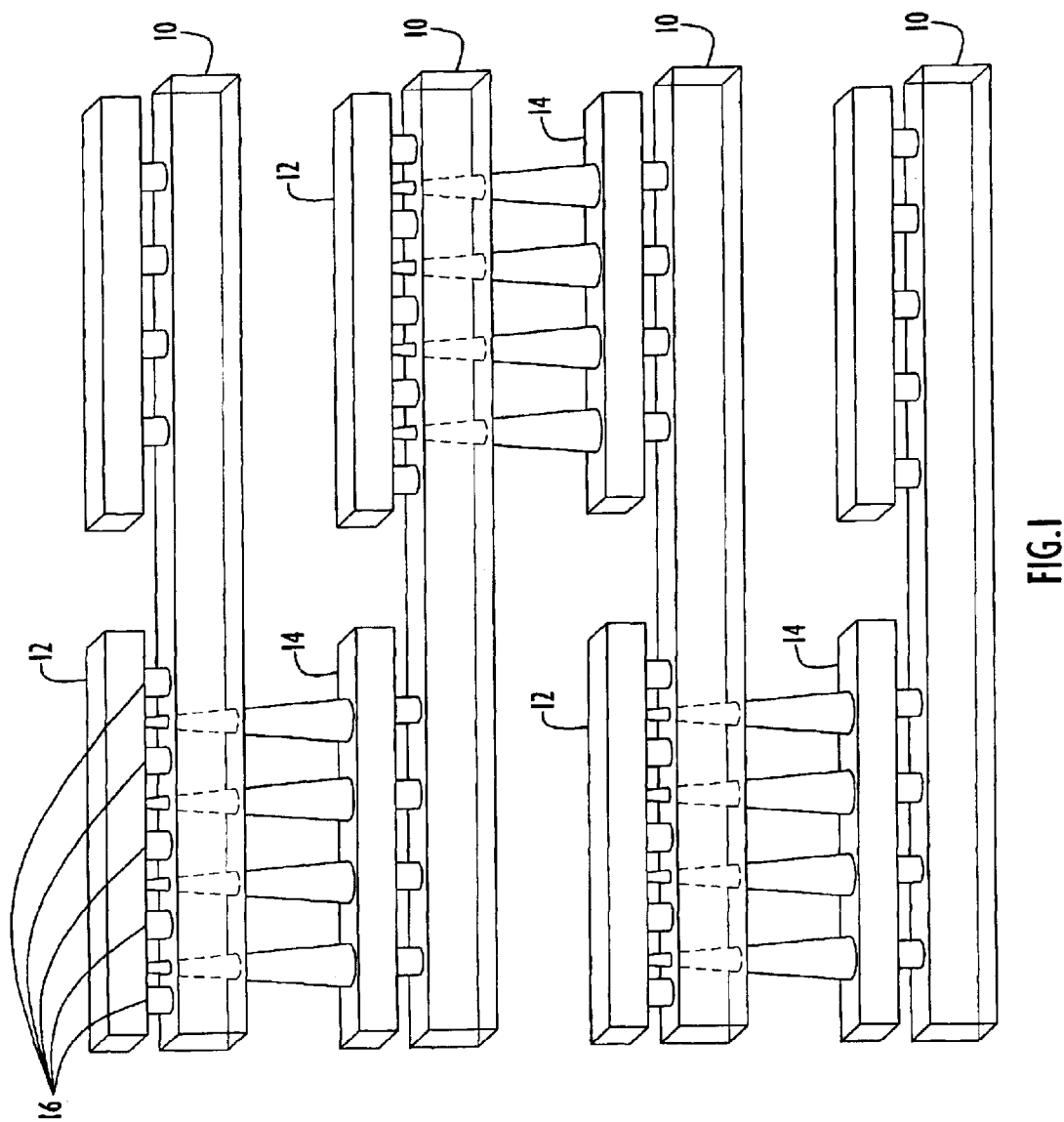
FIG. 1 is a diagrammatic illustration of a stacked array CMOS architecture employing VCSELs and optical detectors bonded to CMOS SOS chips to facilitate high-speed optical communication between CMOS circuitry formed on the SOS chips.

By way of non-limiting example, the optical receiver of the present invention can be employed in a stacked array of VCSELs and optical detectors bonded to silicon on sapphire (SOS) chips shown in FIG. 1. SOS chips 10 are formed by growing thin films of silicon on sapphire substrates, and electronic circuits, including bonding points, are fabricated in the silicon using known techniques. VCSEL arrays 12 and detector arrays 14 are formed by known means on separate substrates, including bonding points which correspond to those on the SOS chips 10. The VCSEL and detector arrays are mechanically and electrically bonded to the SOS chips 10 at their respective bond points via bonds 16, such as solder joints, applied using suitable bonding techniques, such as flip-chip bonding.

As shown in FIG. 1, VCSEL light must be transmitted through a CMOS substrate for multilevel detection and transmission to occur. Bulk CMOS wafers are opaque to optical wavelengths below 1300 nm. Production VCSELs and semiconductor lasers often laze below these wavelengths. Since sapphire substrate is optically transparent for wavelengths below 6 μm and can act as a substrate for high speed CMOS, it is an ideal material for the production of CMOS chips supporting opto-electronic communication. In the stacked arrangement shown in FIG. 1, each VCSEL transmits optical signals through the sapphire substrate of the circuit to which the VCSEL is electrically connected, and the optical signal is received by an optical detector disposed on the side of the SOS chip opposite the VCSEL. Each detector array is in turn electrically connected to another SOS chip and supplies the detected signal to the circuitry formed on the connected SOS chip. In this manner, signals from the circuitry on one SOS chips can be optically transmitted to another SOS chip. The fabrication and structure of stacked circuits like that shown in FIG. 1 are described in detail in U.S. patent application Ser. No. 09/658,259 (corresponding to international publication No. WO 01/97294), the disclosure of which is incorporated herein by reference in its entirety.

In FIG. 1, optical signals travel through free-space gaps between the SOS chips and adjacent detector arrays. The size of these gaps depends on the overall structure of the device and can vary from on the order of a millimeter to a meter depending on the optics (e.g., lenses, etc.) used. Optionally, the optical signals can be transmitted from the sapphire substrate to the optical detector via optical fiber bonded to sapphire substrate at one end and to the optical detector at the other end, permitting fiber bundles to deliver signals to detector arrays over greater distances.

While the optical receiver of the exemplary embodiment disclosed herein is formed in silicon on a sapphire substrate, it will be understood that the present invention is not limited to sapphire substrates. The optical receiver can be formed using any suitable transparent, insulating substrate, including for example, spinel. More generally, in configurations where optical signals are not required to pass through a transparent substrate, the optical receiver of the present invention can be formed on any suitable insulating substrate in a silicon on insulator (SOI) process.

Figure 2:
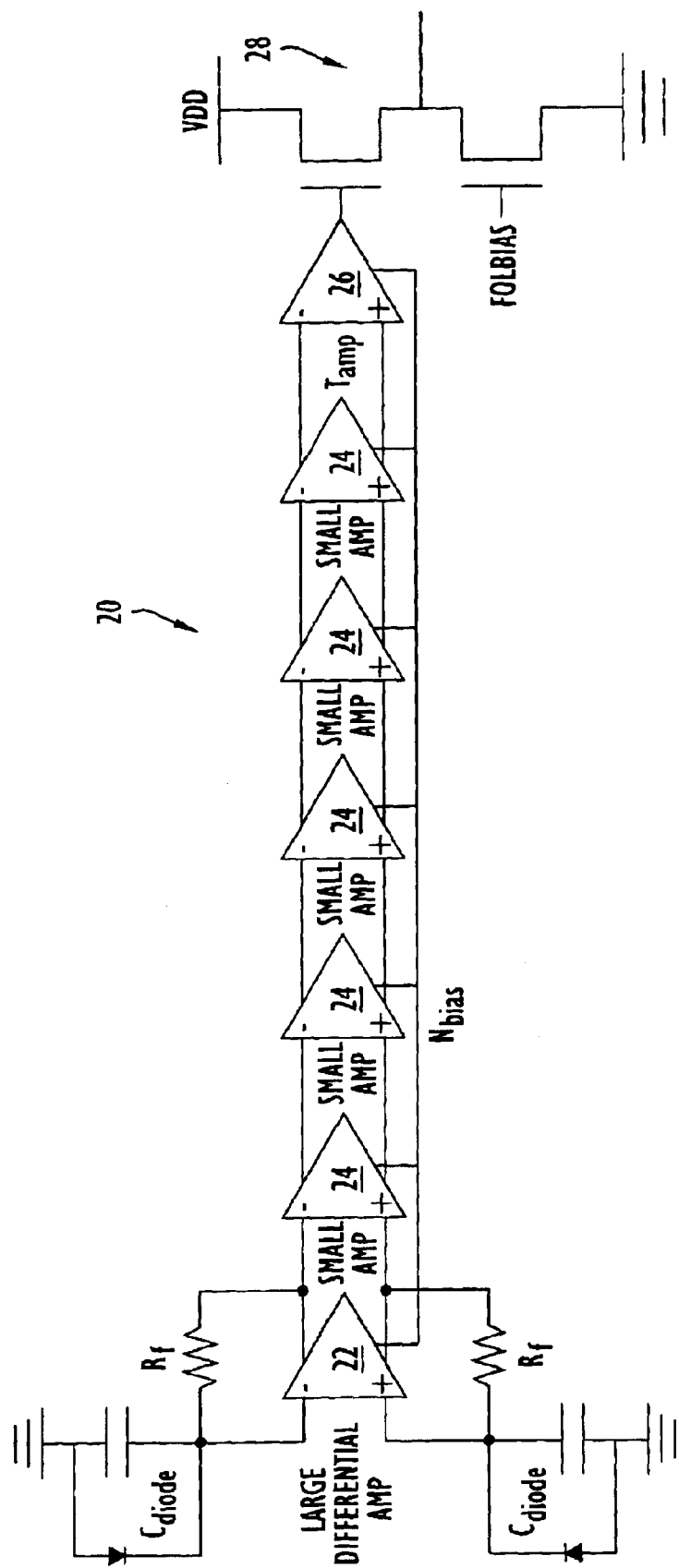
FIG. 2 is a diagram of an optical receiver architecture according to an exemplary embodiment of the present invention.

A receiver architecture according to an exemplary embodiment of the present invention is illustrated in FIG. 2. The multi-stage circuit shown in FIG. 2 corresponds to a single receiver channel and can be used as an isolated, single receiver channel or as an element of an array, such as a receiver channel associated with one of the optical detectors of the arrays shown in FIG. 1. The receiver 20 comprises a first differential transimpedance stage 22 followed by a plurality of differential feed-forward, high-bandwidth gain stages 24 and a final, differential-to-single-ended converter output stage 26. Also shown in FIG. 2 is a buffer 28 biased with a follower bias signal (folbias), which is useful for testing purposes. Buffer 28 is designed to drive a 50Ω load, and limits the bandwidth of the amplifier slightly below the designed 550 MHz amplifier bandwidth. In an operational circuit, buffer 28 would not be used.

The inputs of the transimpedance stage 22 each receive an input signal from a metal-semiconductor-metal (MSM) or PIN diode photo-detector. The metal-semiconductor-metal (MSM) or PIN diodes in this configuration are represented as reverse biased diodes in parallel with a 0.5 pF capacitor ($C_{diode}$). While the exemplary embodiment depicts MSM or PIN diode photo-detectors, the present invention is not limited to any particular type of photo-detector or specific photo-detector characteristics. The input differential transimpedance stage includes two 4.5 kΩ feedback resistors $R_f$, resulting in a differential gain of 50 kΩ and a single ended gain of 25 kΩ. Each of the feedback resistors $R_f$ is connected in a feedback path between one of the differential amplifier inputs and one of the differential amplifier outputs.

A differential signal is supplied to the differential transimpedance amplifier 22 when two different optical signals are incident upon the two photo-detectors respectively coupled to the two inputs of amplifier 22. Other than the requirement that signals be presented as differential signals to the input amplifier 22, the invention is not limited to any particular signal modulation or encoding scheme. For example, where an optical signal designates one of two logical states via positive and negative voltages, a differential signal can be generated by positioning one of the two photo-detectors to receive the optical signal and positioning the other photo-detector not to receive the optical signal. In this case, the signal from the second photo-detector essentially serves as a reference for the signal received from the first photo-detector. In accordance with another example, the optical signal itself may by a differential signal, with each photo-detector receiving a component of the differential signal.

Considering the case where the optical signal is received by one of the two photo-detectors, when an optical pulse within a range of wavelengths is incident on the photo-detector, current flows through the diode to ground. Since the inputs of the differential amplifier are high impedance nodes, current will also flow through resistor $R_f$, causing a ΔV of $(I_{photo1} - I_{photo2})R_f$ across the outputs of the transimpedance stage. The small amplifiers 24 amplify this differential signal sequentially. Signals incident on the converter stage 26 ($T_{AMP}$) are then compared. By way of example, a positive ΔV results in a high output, while a negative ΔV results in a low output, thereby representing two logical states (i.e., a zero bit or a one bit).

The design approach of the architecture shown in FIG. 2 is to maintain high bit rates while limiting power consumption per receiver channel below what could cause heating for a multi-channel chip. The receiver is designed in a silicon CMOS process which permits standard logic to be used. The transimpedance input stage 22 allows high data rates to be achieved. In "Design of Analog-Digital VLSI Circuits for Telecommunications and Signal Processing," Chapter 5, Prentice Hall, 1994 (the disclosure of which is incorporated herein by reference), Heatley et al. demonstrated that a transimpedance amplifier will provide a good tradeoff between bandwidth and sensitivity when compared to high and low impedance designs. The first stage has a transimpedance of 4.5 kΩ and is designed for better than gigabit operation with a 0.5 pF input capacitance, generated by a metal-semiconductor-metal (MSM) or PIN diode photo-detector from which the transimpedance input stage receives the input signal. It will be understood that the present invention is not limited to the particular impedances provided in the exemplary embodiment. While five high-bandwidth gain stages are shown in FIG. 2, it may not be necessary in many applications to have such high gain if large photo-currents are generated by the photo-detector. In this case, bandwidth can be improved through the use of both smaller feedback resistors $R_f$ and fewer gain stages. In general, any suitable number of gain stages can be used, depending on the particular operating requirements of the system. In the exemplary embodiment, 10 μA of switching current on each receiver input, or 20 μA on one input will generate a rail-to-rail output swing for a 3.3 V supply in this configuration. The transimpedance amplifier has a phase margin of 45° for limited peaking.

This optical receiver design shown in FIG. 2 has several unique features well-suited to the multi-chip optical interconnect application. First, the optical receiver is differential. A differential design is robust to process variations which may vary device properties, power supply noise, as well as to ambient light conditions. These properties make the optical receiver ideal for use among an array of VCSEL inputs switched about a lasing threshold. Below threshold VCSELs output light in the LED region which may saturate non-adaptive, single-ended receivers. Adaptive receivers lose low frequency information. Differential designs can resolve signals in ambient light without loss of low frequency information, as shown by the eye diagrams in FIGS. 8A and 8B.

The receiver is preferably fabricated in silicon on sapphire (SOS) (or, more generally, silicon on insulator) without parasitic bulk capacitances. To the inventors' knowledge, no fully differential amplifier has been formed using silicon on insulator to date. This feature enables the design of faster circuits with small load capacitances. Furthermore, the absence of a conductive bulk allows for the design of high gain, multi-stage amplifiers without instability due to substrate feedback. A multi-stage amplifier such as that shown in the optical receiver of FIG. 2 would not be feasible in a bulk process due to parasitic capacitance that would cause instability. Commercially available Ultra-thin Silicon on Sapphire (Utsi) processes also provide p and n devices with three doping levels. Typically, ultra-thin silicon on sapphire is characterized by silicon films having a thickness of less than approximately 150 nm. Zero threshold devices with no doping can be made to output the same currents as doped devices with larger gates. Thus, smaller devices can be used, and gate capacitance can be minimized in certain cases.

In the design of an array-able receiver, consideration of interference rejection and power supply noise rejection as well as power consumption and small-footprint are crucial. The optical receiver of the present invention is fully differential, permitting rejection of interference, electrical offsets, and power supply noise. The present invention has several advantages over previous designs in this respect. The inputs to the optical receiver shown in FIG. 2 do not go through separate pre-amplifiers; thus, offsets due to process variations from pre-amplifiers are not amplified in subsequent stages of the architecture, smaller signals can be resolved, and less power is consumed. Direct subtraction of input signals reduces interference and offsets due to ambient light signals. Circuits with pre-amplifiers may saturate in high ambient light conditions where fully differential circuits will not.

Figure 3:
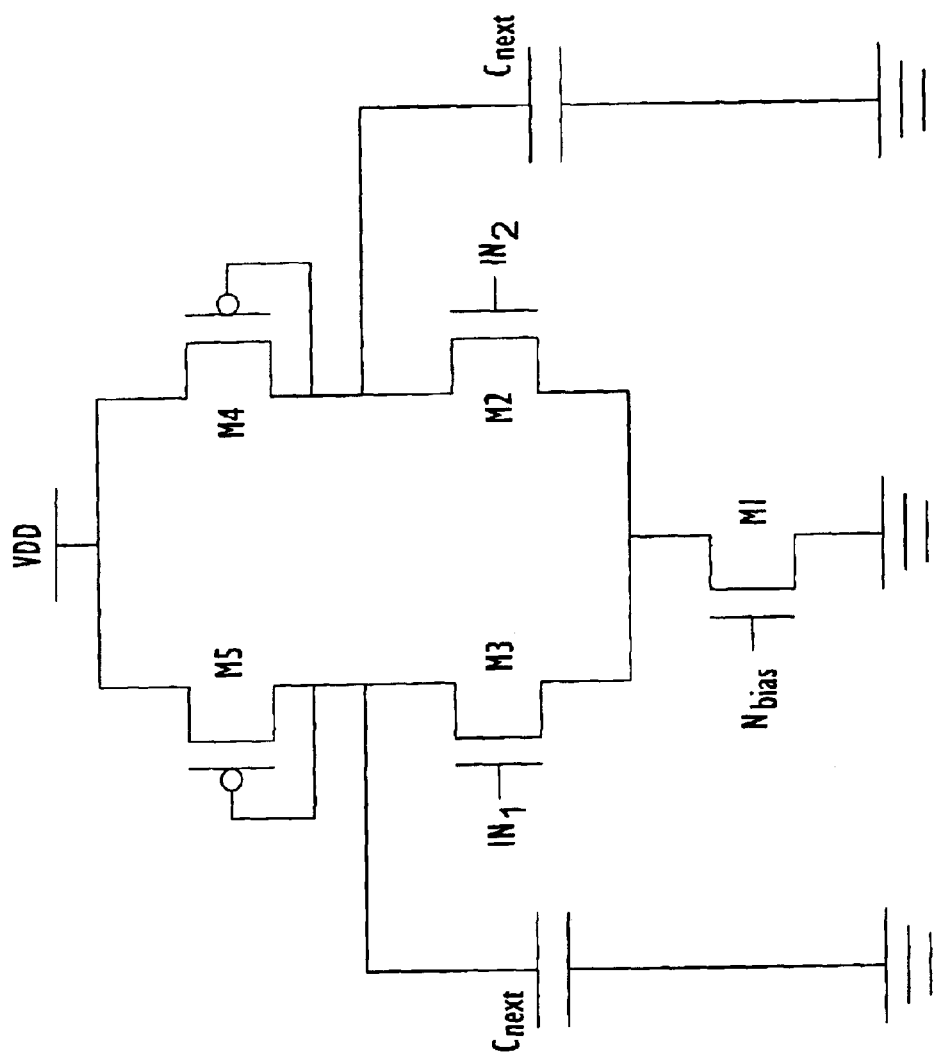
FIG. 3 is a circuit diagram of a differential amplifier used in the feed-forward intermediate amplifier stages of the optical receiver of the exemplary embodiment of the present invention.
Figure 4:
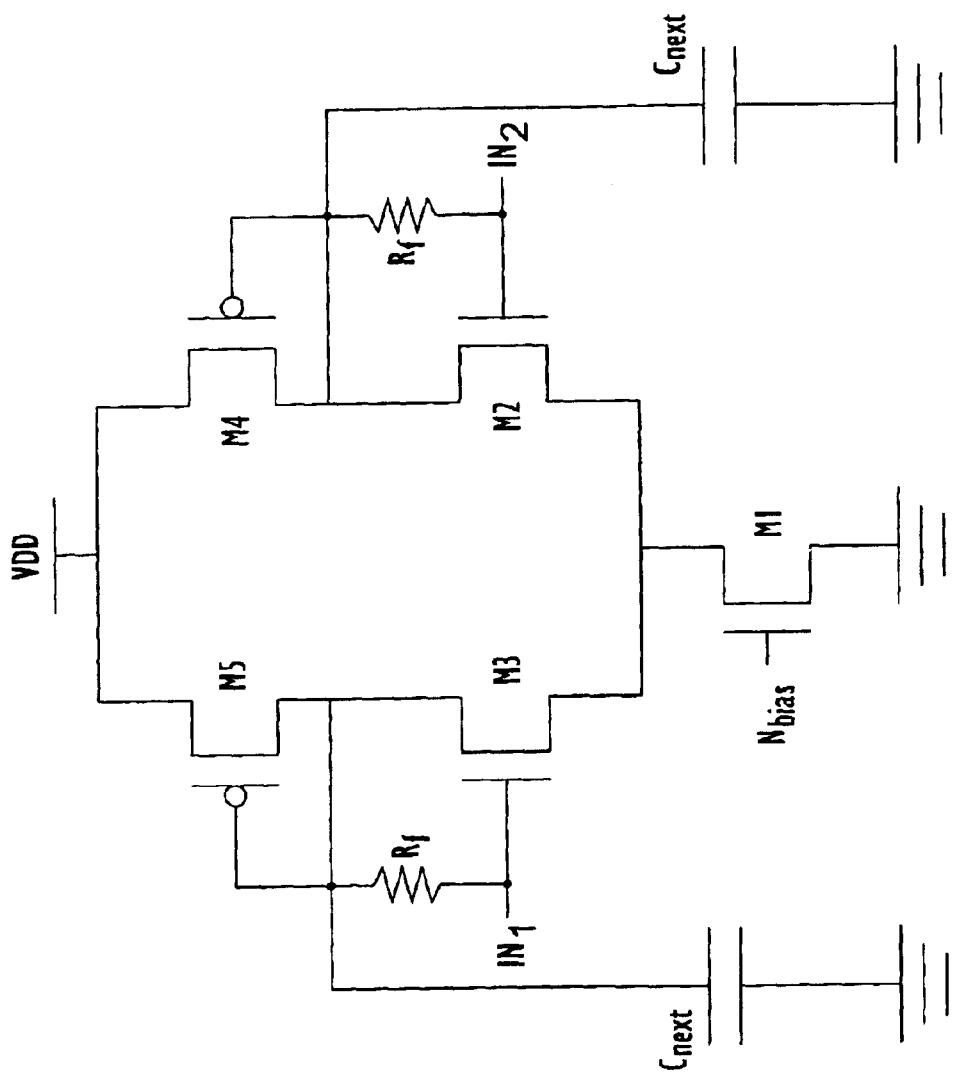
FIG. 4 is a circuit diagram of the first stage transimpedance differential amplifier of the optical receiver according to the exemplary embodiment of the present invention.

According to the exemplary embodiment, the differential amplifier circuit design used in the transimpedance stage 22 and subsequent gain stages 24 is shown in FIG. 3. FIG. 4 more particularly shows this amplifier circuit with the feedback resistors employed in the transimpedance stage 22. Referring to FIG. 3, a voltage source $V_{dd}$ is coupled to the sources of two PFETs M4 and M5. The gate and drain of transistor M4 are directly connected to each other. Likewise the gate and drain of transistor M5 are directly connected to each other. The drain of transistor M4 is also connected to the drain of an NFET M2, and the drain of transistor M5 is connected to the drain of an NFET M3. The sources of transistors M2 and M3 are connected in common to another NFET M1, which is coupled to ground. The gate of transistor M1 receives a constant bias signal $B_{bias}$. The gate of transistor M3 receives one of the differential inputs (Input 1), and the gate of transistor M2 receives the other differential input (Input 2). The two amplifier outputs are at the M3/M5 drain node and the M2/M4 drain node, respectively. Capacitance from the next amplifier stage is depicted by capacitors $C_{next}$ connected between the output nodes and ground. FIG. 4 differs from FIG. 3 in that the feedback resistors $R_f$ used in the transimpedance stage extend between the input nodes at the gates of transistors M3 and M2 and the output nodes at the drains of transistors M3/M5 and M2/M4, respectively.

As previously indicated, an object of the present invention is to provide a low power, compact, array-able signal receiver. Several factors make the circuit design of the optical receiver of the present invention compact and low-power. UN-doped PFETs M4 and M5 are used to provide self-biased current sources shown in FIGS. 3 and 4. These transistors can be designed with smaller gates than doped transistors. In addition to contributing a compact design, amplifier loads are decreased and less power is required to achieve bandwidth requirements. NFET current source M1 is also intrinsically doped to provide a bias current with a small area footprint.

The internal amplifier stages of the optical receiver are carefully designed to reject both interference and offsets as described. It is important to design both sides of the differential amplifier to be balanced so that interference and offsets are rejected evenly. It is also important to bias this circuit in a high gain operating region for optimal performance. The circuit shown in FIG. 3 accomplishes both these tasks by providing a self-biasing load on both sides of a symmetric amplifier. This cannot occur in a mirror configuration which would either provide unequal loads for the amplifier outputs and/or potentially add offsets to the output via inexact matching of mirror transistors.

Power supply noise rejection in this receiver is achieved through the use of amplifiers with a common source load. A simple cascade circuit will accomplish some power supply noise rejection if the cascade is biased from the same power supply. However, it is preferable to mirror supply fluctuations at the source, since linear rejection is improved and circuit bandwidth is not degraded.

In operation, when Input 1 and Input 2 are equal, the total current through NFET transistors M2 and M3 equals the current through transistor M1. The drain of M1 will adjust to maintain $V_{gs}$ across transistors M2 and M3 such that they each pass $0.5I_{bias}$. Vgs of transistors M4 and M5 will also adjust to pass $0.5I_{bias}$. The outputs of the amplifier will be roughly equal to each other and can be biased between $V_{DD}$ and ground. As Input 1 increases above Input 2, the drain of transistor M1 will follow Input 1, while maintaining $V_{gs}$'s on transistors M2 and M3, so that they pass a combined current of $I_{bias}$. As the drain of transistor M1 follows Input 1, transistor M2 will turn off, sending the gate of transistor M4 high. The gate of transistor M5, conversely, will adjust low to accommodate additional current through transistor M3.

Though the operation of this circuit is the same for the gain and transimpedance stages, transistors in the gain stage amplifiers 24 are smaller than those in the transimpedance amplifier 22. A chain of small-gain stages can be fast while consuming little power, since the input transistors of each gain stage comprise the load of another stage. Small capacitive loads enable the gain stages 24 to maintain a high operating bandwidth. Large input transistors in the transimpedance amplifier 22 improve the gain of the first stage without significantly affecting the load on this amplifier and therefore its bandwidth as such transistors would in subsequent gain stages. The bandwidth of the transimpedance amplifier 22 is dominated by input capacitance, feedback resistance, and the gain of internal differential amplifier. The bandwidth is not linearly degraded by large input gates, because the expected capacitive load from MSM or PIN photo-detectors at the amplifier input will be large (0.5 pF) compared to the additional parallel capacitance of large input gates (0.1 pF). Furthermore, the feed-forward gain of the first stage amplifier is directly proportional to the bandwidth of the feedback transimpedance amplifier.

Use of input transistors with higher gate thresholds than the PFET load and the NFET current course transistors further augment both the gain and bandwidth of the differential amplifier. Diode connected PFET current sources/loads are constructed from lower threshold intrinsic transistors in order to limit capacitive loading on the amplifier's output node for a given resistive load, while intrinsically doped NFET current sources also maximize current per unit area. The NFET input transistors are higher threshold, since they exhibit a higher $g_m$ at equal currents to zero threshold intrinsic devices. Higher $g_m$ input transistors result in a higher gain bandwidth product for this differential amplifier.

The diode-connected PFETs in this design enable the PFET current sources to automatically bias themselves in a high gain operating region without the need for complicated biasing circuitry. As a result, the receiver circuit requires only one bias, in addition to $V_{dd}$ and ground.

Thus, an important aspect of the present invention which is facilitated by the use of silicon on insulator technology is the use of varied or different threshold transistors within each differential amplifier stage (i.e., certain transistors have different gate threshold levels than other transistors). With a lower threshold, such as a zero-volt or near zero-volt threshold, more current results from a lower voltage, thereby yielding more current per unit size from the transistor, reducing the overall size of the footprint of the circuit, and improving the bandwidth by decreasing the parasitic capacitance. Consequently, low-threshold transistors M1, M4 and M5 can be used as current sources. However, such transistors tend to have the unfortunate effect of having high leakages; thus, it is desirable that the switching transistors on the input (M2 and M3) have higher thresholds (e.g., on the order of 0.3 to 0.7 volts) to facilitate turning on and off the transistors.

Figure 5:
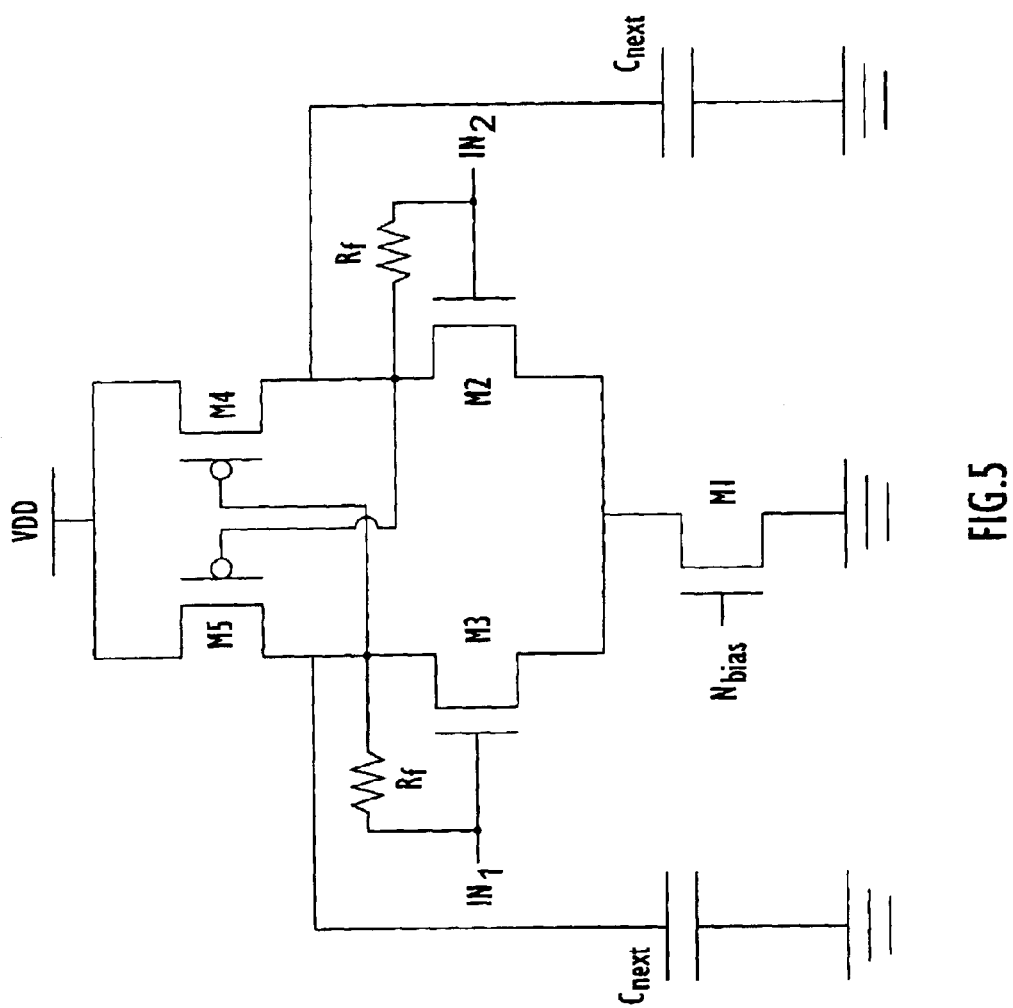
FIG. 5 is a circuit diagram of an alternative embodiment of the first stage transimpedance amplifier of the optical receiver according to the exemplary embodiment of the present invention.

Another embodiment of the receiver circuit of the present invention can be constructed in the same manner by replacing the aforementioned transimpedance stage shown in FIG. 4 with the cross-coupled transimpedance stage shown in FIG. 5. The operation of the amplifier circuit shown in FIG. 5 is similar to the operation of the diode-load amplifier. The difference between the two circuits results from changing the negative control feedback of the diode loads into a positive feedback. Specifically, the gate of PFET M5 is coupled to the M4/M2 drain node (Output 2) rather than the M5/M3 drain node (Output 1), and the gate of PFET M4 is coupled to the M5/M3 drain node (Output 1) rather than the M4/M2 drain node (Output 2). In a strictly feed-forward architecture, the amplifier of FIG. 5 will typically become unstable and the outputs will settle at the rails. However, the additional negative feedback of the feedback resistor, $R_f$, ensures that this architecture will be stable when $g_m$ of the input transistors is larger than $g_m$ of the PFETs.

The transimpedance amplifier in FIG. 5 is preferred as a first stage in the receiver architecture when capacitive loads from optical detectors can be made small, since high gain can be achieved in this architecture without large input gates. In this case, large input gates will load the amplifier and decrease bandwidth, while smaller input gates with the same amplifier gain will improve overall transimpedance bandwidth. As in the diode-load amplifier (FIGS. 3 and 4), the use of intrinsic PFET loads augments gain in this amplifier, and the use of intrinsic NFET current sources promotes efficient use of area.

Figure 6A:
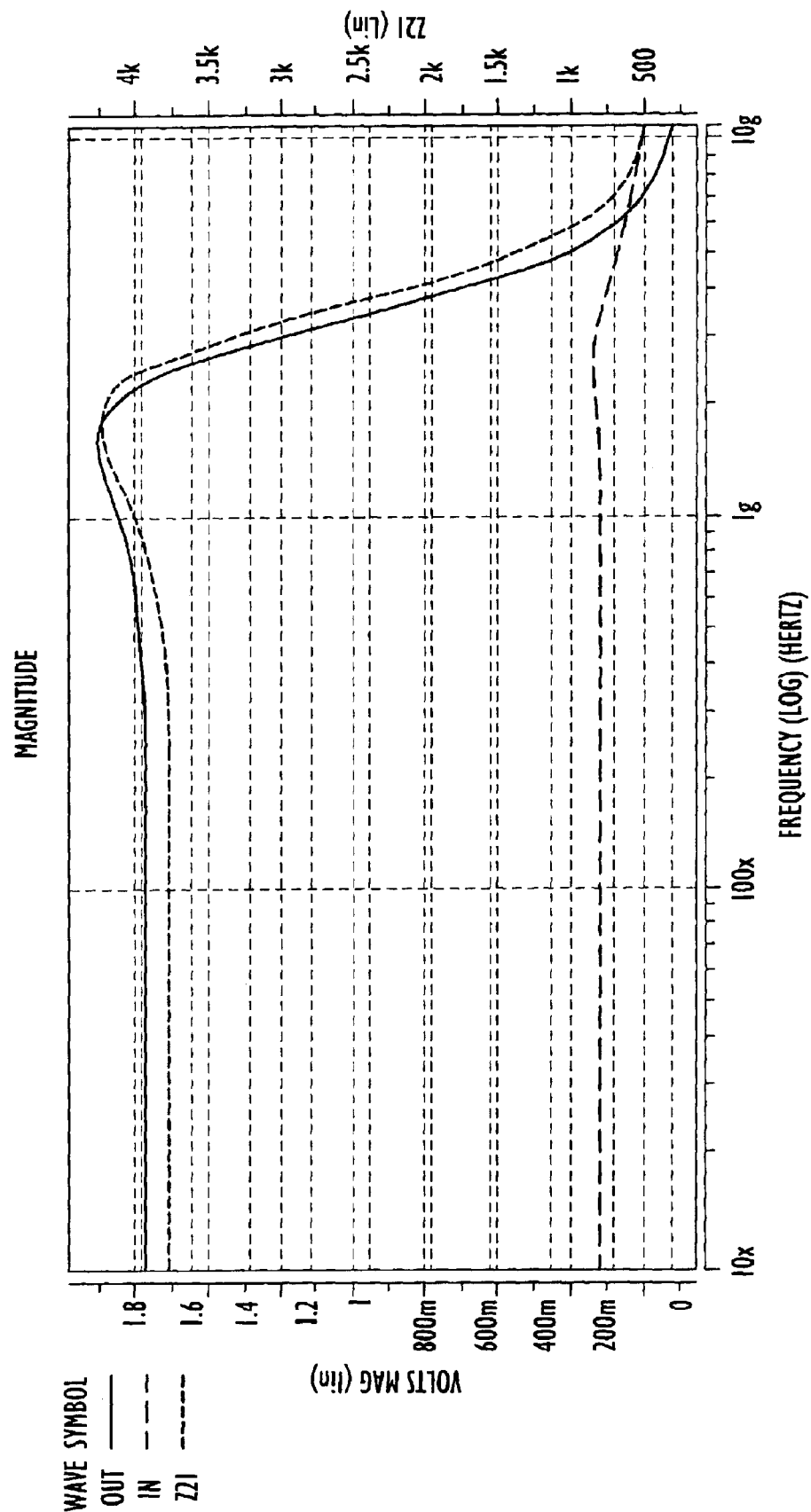
FIGS. 6A and 6B are graphs respectively illustrating the magnitude and phase of a simulated transfer function of a full silicon on sapphire receiver using a cross-coupled amplifier with a low-capacitance input load.
Figure 6B:
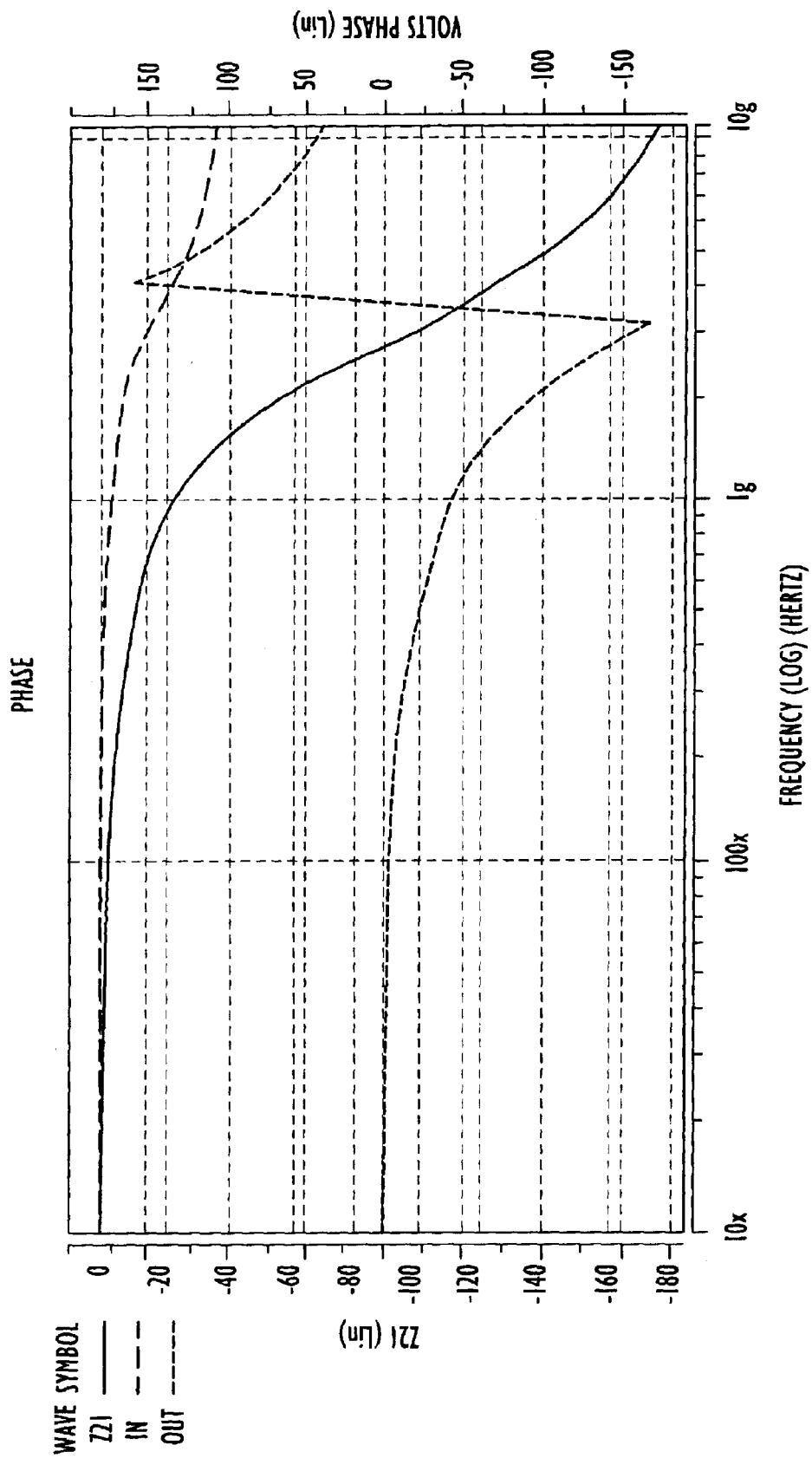

FIGS. 6A and 6B respectively illustrate the magnitude and phase of a simulated transfer function of a full silicon on sapphire receiver using the cross-coupled amplifier of FIG. 5 with a small input capacitance (i.e., a 50 fF input load). Improved bandwidth results when the receiver is used in this configuration with low input capacitance detectors (MSM or PIN). The power expenditure for the entire circuit in simulation is under 10 mW.

Figure 7:
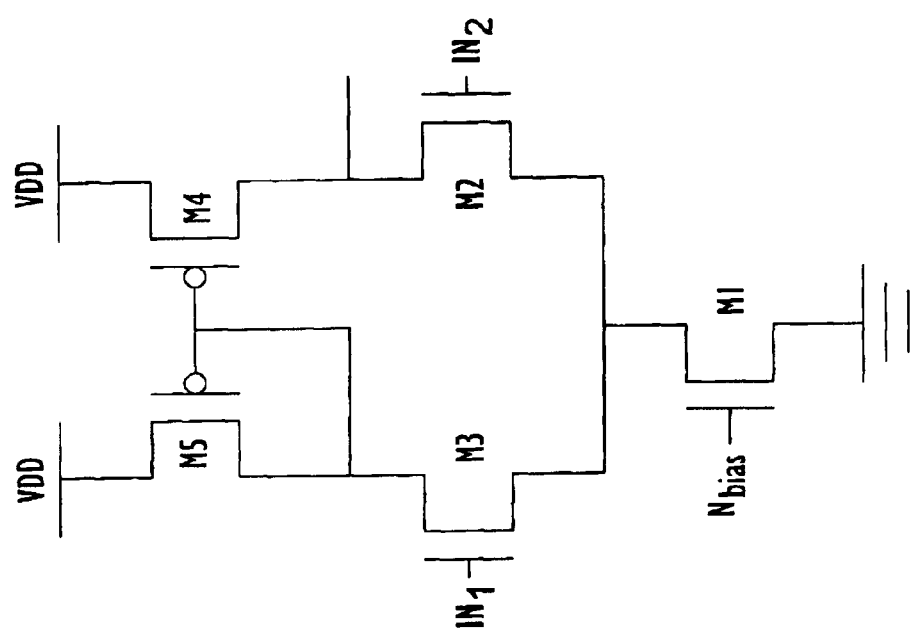
FIG. 7 is a circuit diagram of a final-stage differential-to-single-ended converter of the optical receiver according to the exemplary embodiment of the present invention.

Referring again to FIG. 2, the last stage of the amplifier circuit consists of a differential to single-ended converter 26. This circuit is constructed as a straightforward transimpedance amplifier with PFET current mirrors, as shown in FIG. 7. In particular, in contrast to the gain stage configuration shown in FIG. 3, the gate and drain of PFET transistor M4 are not connected to each other; rather, the gate of PFET transistor M4 is connected to the gate and drain of PFET transistor M5, with the single output being taken at the drain node of transistors M4 and M2. Like the previous differential stages, intrinsic, zero-threshold transistors, are used at current sources, while higher threshold devices are used as input devices to maximize gain-bandwidth product. Small transistors are used in this stage as well, generating a small capacitive load and maintaining the bandwidth of the previous stage. This stage is capable of driving a slightly larger subsequent stage of electronics, such as the input stage to a large output buffer required to drive a 50Ω load.

Figure 8A:
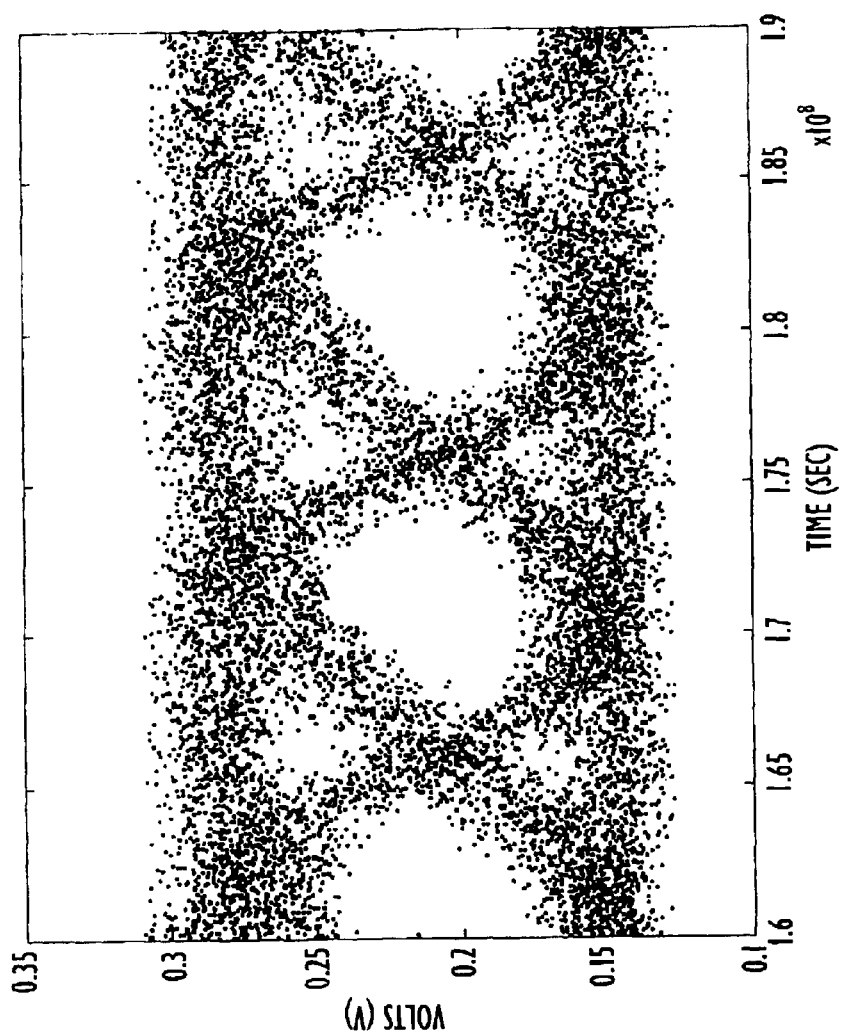
FIGS. 8A and 8B depict eye diagrams of a response of the optical receiver of the present invention to optical input from a VCSEL.
Figure 8B:
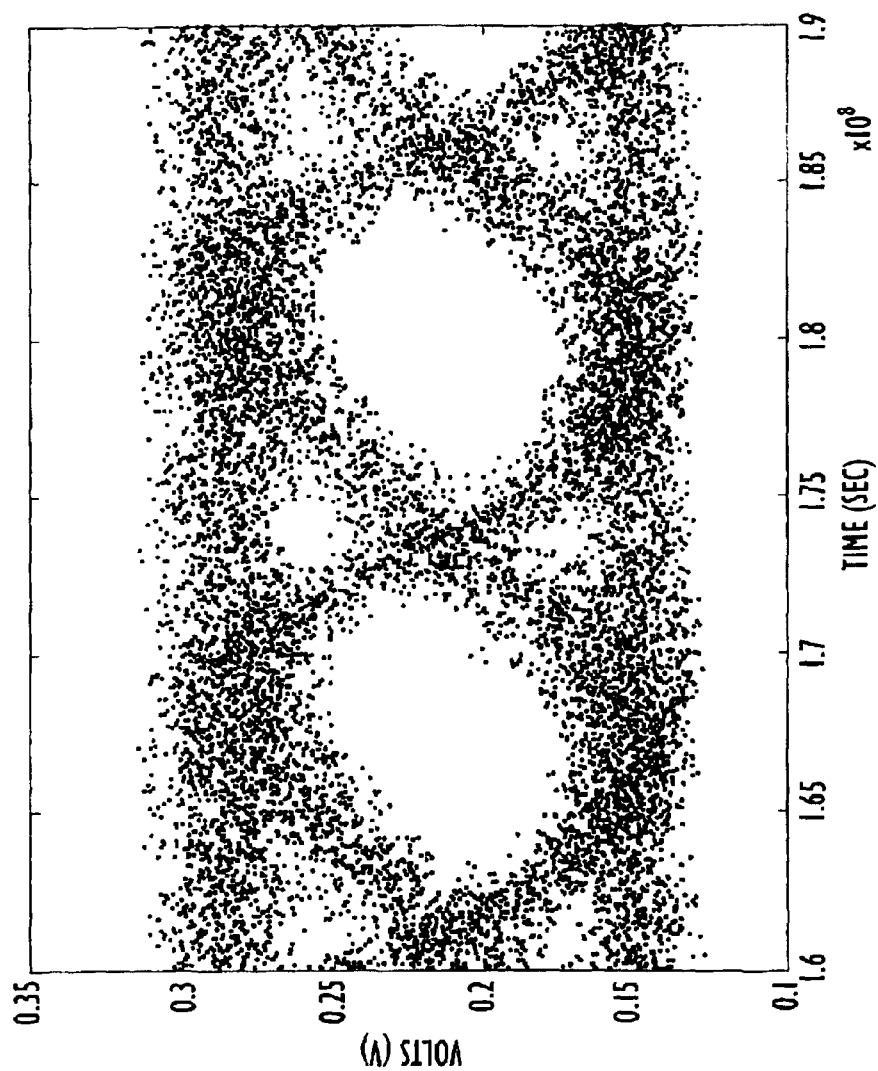

The eye diagrams in FIGS. 8A and 8B respectively show operation of an optical receiver of the present invention at approximately 1 Gb/s and 800 Mb/s with a differential optical input. The data shown was taken with a 0.5 pF MSM bonded to each input, and a VCSEL source incident upon an MSM. Some speckle and jitter in the eye diagrams is due to contributions of the VCSELs and MSM's. The receiver works well with both single and differential inputs; however, gain is reduced when a single input is used.

The eye diagrams demonstrate that the receiver works well over a range of data rates, from relatively low data rates to high data rates. Additional jitter may complicate detection of a clock signal for high data rates, although output signals are still detectable up to 600 MHz. The outputs of the receiver are rail-to-rail internally. However, the output buffers will not drive a 50Ω load rail-to-rail; thus, the output levels on the eye diagram are low. At these data rates, a power consumption of 5 mW was measured for the full receiver circuit at 3.3 V. This is an adequately low power consumption for an array-able design, since an array of 12 receivers would require little external cooling, and an array of 10×10 receivers could be simultaneously active on one chip without requiring extreme cooling methods. In simulation, the first stage requires the most power, 0.85 mW. Compared to commercial transimpedance designs, this is a small power expenditure. The size of the unit cell of this receiver is also an advantage of this design. High power designs often require most of a chip for a single channel, the receiver discussed here is 45×70 μm, in a 5 μm process, and can be arrayed on a chip.

A working linear array of six receivers has been tested. All channels in the array worked at high speeds from a single power supply without notable cross-talk or interference from other channels. Each channel had an output buffer to drive 50 ohms. The buffers consumed up to an additional 60 mW, and typically limit the output swing below 800 mV.

While particularly useful with an optical detector array in the context of a stacked multi-chip SOS CMOS architecture such as that shown in FIG. 1, it will be understood that the optical receiver of the present invention is not limited to use in this particular context. For example, the optical receiver of the present invention can be used in one and two-dimensional arrays of varying sizes, depending on the particular application. More generally, cost effective integration of photonic elements with high-speed silicon CMOS electronics opens the path to opto-electronic interconnects for local computer networks, intracomputer (e.g., chip-to-chip, board-to-board) and even intra-die applications and cross-bar switches. One example of a commercial product which would benefit from the optical receiver of the present invention is a receiving junction for a fiber-optic Ethernet bus. Information from a CMOS chip can be coupled into a fiber bundle on one side of the bus, transmitted via standard Ethernet protocol (850 nm wavelength) to a receiving array directly on a CMOS chip. Since CMOS chips will be able to communicate directly through fiber, data transmission can be fast. Other potential commercial applications for the optical receiver of the present invention include, but are not limited to: wireless and fiber optic telecommunication and data communication links; high speed spatial light modulators (SLM) for image processing and optoelectronic switching; cable TV distribution; light radar (LADAR); control of microwave phased-array antennas; microwave antenna remote feed and return; fiber-optic-guided missile links; tethered robotic vehicle control; and telemetry applications. In general, the optical receiver of the present invention has potential utility in virtually any context in which a weak electrical signal corresponding to detected optical signal requires amplification.

As will be understood from the foregoing, the described optical receiver is a differential transimpedance amplifier designed to efficiently amplify weak electric signals with high speed, high bandwidth, low-power and low heat dissipation. While the differential transimpedance amplifier of the present invention is particularly useful as an optical receiver in the context of reception of low-power optical signals, the differential transimpedance amplifier of the present invention is not limited to use as an optical detector and can be employed in any of a wide variety of contexts to amplify weak or low-power electrical signals to suitable voltage levels.

Having described preferred embodiments of a new and improved low-power, differential optical receiver in silicon on insulator, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A complimentary metal oxide semiconductor (CMOS) differential amplifier, comprising:
   a first transistor including a first node coupled to a voltage source, and a second node and a gate node coupled to each other, such that said first transistor is configured as a self-biased current source;
   a second transistor including a first node coupled to the voltage source, and a second node and a gate node coupled to each other, such that said second transistor is configured as a self-biased current source;
   a third transistor including a first node coupled to the second node of said first transistor and serving as a first output node, a second node, and a gate node serving as a first input node and configured to receive a first input signal;
   a fourth transistor including a first node coupled to the second node of said second transistor and serving as a second output node, a second node coupled to the second node of said third transistor, and a gate node serving as a second input node and configured to receive a second input signal; and
   a fifth transistor including a first node coupled to the second nodes of said third and fourth transistors, a second node coupled to ground, and a gate node configured to receive a bias signal such that said fifth transistor operates as a current source;
   wherein gate threshold voltages of said third and fourth transistors are greater than gate threshold voltages of said first, second and fifth transistors.

2. The differential amplifier of claim 1, wherein said first and second transistors are P-type field effect transistors (PFETs) and said third, fourth and fifth transistors are N-types field effect transistors (NFETs).

3. The differential amplifier of claim 1, wherein said first, second and fifth transistors have substantially zero-volt gate threshold voltages.

4. The differential amplifier of claim 1, wherein said third and fourth transistors have gate threshold voltages in the range between approximately 0.3 to 0.7 volts.

5. The differential amplifier of claim 1, wherein said differential amplifier is formed in semiconductor on an insulating substrate.

6. The differential amplifier of claim 5, wherein said differential amplifier is formed in silicon on a transparert insulating substrate.

7. The differential amplifier of claim 6, wherein said differential amplifier is formed in ultra-thin silicon on a sapphire substrate.

8. The differential amplifier of claim 1, wherein said differential amplifier is a transimpedance amplifier further comprising a first feedback resistor coupling the first output node to the first input node and a second feedback resistor coupling the second output node to the second input node.

9. A complimentary metal oxide semiconductor (CMOS) differential transimpedance amplifier, comprising:
   a first transistor including a first node coupled to a voltage source, a second node serving as a first output node, and a gate node;
   a second transistor including a first node coupled to the voltage source, a second node serving as a second output node and coupled to the gate node of the first transistor, and a gate node coupled to the first output node;
   a third transistor including a first node coupled to the first output node, a second node, and a gate node serving as a first input node and configured to receive a first input signal;
   a fourth transistor including a first node coupled to the second output node, a second node coupled to the second node of the third transistor, and a gate node serving as a second input node and configured to receive a second input signal;

a fifth transistor including a first node coupled to the second nodes of said third and fourth transistors, a second node coupled to ground, and a gate node configured to receive a bias signal;

a first feedback resistor coupling the first output node to the first input node; and a second feedback resistor coupling the second output node to the second input node.

10. The CMOS differential transimpedance amplifier of claim 9, wherein said first, second and fifth transistors operate as current sources.

11. The CMOS differential transimpedance amplifier of claim 9, wherein gate threshold voltages of said third and fourth transistors are greater than gate threshold voltages of said first, second and fifth transistors.

12. The CMOS differential transimpedance amplifier of claim 9, wherein said first and second transistors are P-type field effect transistors (PFETs) and said third, fourth and fifth transistors are N-types field effect transistors (NFETs).

13. The CMOS differential transimpedance amplifier of claim 9, wherein said first, second and fifth transistors have substantially zero-volt gate threshold voltages.

14. The CMOS differential transimpedance amplifier of claim 9, wherein said third and fourth transistors have gate threshold voltages in the range between approximately 0.3 to 0.7 volts.

15. CMOS differential transimpedance amplifier of claim 9, wherein said differental amplifier is formed in semiconductor on an insulating substrate.

16. The CMOS differential transimpedance amplifier of claim 15, wherein said differential amplifier is formed in silicon on a transparent, insulating substrate.

17. The CMOS differential transimpedance amplifier of claim 16, wherein said differential amplifier is formed in ultra-thin silicon on sapphire substrate.

* * * * *